(12) United States Patent
Morimoto

(10) Patent No.: US 6,828,798 B2
(45) Date of Patent: Dec. 7, 2004

(54) METHOD FOR INSPECTING RELAY CONTACTS FOR CONTACT WELD IN BATTERY POWER SOURCE DEVICE

(75) Inventor: Naohisa Morimoto, Toyohashi (JP)

(73) Assignee: Panasonic EV Energy Co., Ltd., Shizuoka (JP)

(*) Notice: Subject to any disclaimer, the term of this patent is extended or adjusted under 35 U.S.C. 154(b) by 24 days.

(21) Appl. No.: 10/330,117

(22) Filed: Dec. 30, 2002

(65) Prior Publication Data

US 2004/0061503 A1 Apr. 1, 2004

(30) Foreign Application Priority Data

Jan. 10, 2002 (JP) .................................. 2002-003142

(51) Int. Cl.⁷ .............................................. G01R 31/08
(52) U.S. Cl. ..................................... 324/527; 324/418
(58) Field of Search ..................... 307/10; 320/132; 324/73.1, 418, 421, 426, 503, 511, 522

(56) References Cited

U.S. PATENT DOCUMENTS 5,134,375 A * 7/1992 Fuchi .......................... 324/419
6,504,344 B1 * 1/2003 Adams et al. ............... 320/132
6,563,230 B2 * 5/2003 Nada ........................... 290/40 C

* cited by examiner

Primary Examiner—Anjan Deb
Assistant Examiner—Walter Benson
(74) Attorney, Agent, or Firm—Greenblum & Bernstein, P.L.C.

(57) ABSTRACT

A method for inspecting relay open/close contacts for a contact weld is provided, each relay open/close contact being connected serially to each of a plurality of battery pack blocks. Battery ECUs for controlling the operating condition of each of the battery pack blocks employ one battery pack block for transmitting an inspection signal and the other battery pack blocks for receiving the inspection signal, such that the transmitting battery ECU transmits the inspection signal with its open/close contact closed. When any one of the other battery pack blocks receives the inspection signal at its battery ECU in which its open/close contact has not been closed, the open/close contact is determined to be welded. This inspection is performed successively with the transmitting and receiving battery ECUs being employed alternately in order to check the plurality of open/close contacts and their secondary open/close contacts for a contact weld.

5 Claims, 4 Drawing Sheets

METHOD FOR INSPECTING RELAY CONTACTS FOR CONTACT WELD IN BATTERY POWER SOURCE DEVICE

The present disclosure relates to subject matter contained in priority Japanese Patent Application No. 2002-3142, filed on Jan. 10, 2002, the contents of which is herein expressly incorporated by reference in its entirety.

BACKGROUND OF THE INVENTION

1. Field of the Invention

The present invention relates to a method for inspecting relay contacts for a contact weld in a battery power source device that is installed in large-sized hybrid vehicles.

2. Description of Related Art

A battery power source device employed as a power source for a motor to drive vehicles such as hybrid cars includes a battery pack block, having a plurality of battery modules (e.g., 30 battery modules) connected in series, each battery module having a plurality of rechargeable batteries (e.g., 6 batteries) connected in series. To provide control to the operating condition of the battery pack block, the battery power source device further includes a battery ECU (Electronic Control Unit) for detecting the voltage, current, and temperature of the battery pack block to detect abnormal condition thereof or provide various types of control thereto in accordance with the results of the detection. Such a battery power source device is configured to supply power to the driving motor and to be charged by the power from the generator of the vehicle.

To supply a large power to large vehicles, battery pack systems, each having a battery pack block and an ECU in combination, are designed to connect with each other serially and/or in parallel.

With this arrangement, there is a possibility of a contact weld occurring at an open/close contact for opening or closing an input/output circuit in the battery pack block. A contact weld would make it difficult not only to prevent operators from receiving an electric shock during assembly or maintenance but also to provide proper control under abnormal conditions. What is worse, a contact weld in an open/close contact would ruin the function for limiting an inrush current, thereby causing an excessive inrush current to exert a harmful effect.

A small hybrid vehicle as requiring a relatively small power has usually one battery pack block. In this case, as shown in FIG. 4, a battery pack block 22 is checked for a contact weld of its open/close contacts by connecting a voltage sensor 17 between a positive charge/discharge terminal 15 and a negative charge/discharge terminal 16 of a battery power source device 21 to check open/close contacts 24, 25, and 26 for a contact weld.

First, the secondary open/close contact 26 on the positive side is turned on, and a resistor 27 is allowed to limit an inrush current charged into a smoothing capacitor 18 that is connected between the positive charge/discharge terminal 15 and the negative charge/discharge terminal 16. At this time, when the voltage sensor 17 detects no voltage nearly equal to the voltage of the battery pack block 22, the open/close contact 25 on the negative side is determined not to be welded, whereas being determined to be welded when an approximately equal voltage has been detected. In other words, the contact is determined to remain closed due to a contact weld. Suppose that the open/close contact 24 and the secondary open/close contact 26 on the positive side are turned off and the open/close contact 25 on the negative side is then turned on, and that the voltage detected by the voltage sensor 17 is sufficiently lower than the voltage of the battery pack block. In this case, the open/close contact 24 and the secondary open/close contact 26 on the positive side are determined not to be welded, whereas either the open/close contact 24 or the secondary open/close contact 26 is determined to be welded when a voltage nearly equal to the voltage of the battery pack block 22 is detected.

However, according to the conventional method described above, the battery power source device 21 had to be externally provided with the voltage sensor 17 and connected to the voltage sensor 17 via wiring. Additionally, a method for inspecting a battery power source device employing a plurality of battery pack blocks by means of the voltage sensor 17 for a contact weld would require a long time for the contact weld inspection.

SUMMARY OF THE INVENTION

An object of the present invention is to provide a method for inspecting relay open/close contacts for a contact weld in a battery power source device, the method enabling the inspection of the open/close contacts for a contact weld to be carried out by the relays that are provided in each of a plurality of battery pack systems of the battery power source device.

To achieve the aforementioned object, the present invention provides a method for inspecting relay contacts for a contact weld in a battery power source device. The battery power source device includes: a plurality of battery pack blocks connected serially and/or in parallel, the battery pack blocks each having a plurality of rechargeable batteries serially connected, for charging and discharging operations in a vehicle via a positive charge/discharge terminal and a negative charge/discharge terminal; a plurality of battery ECUs each connected with the battery pack blocks, for controlling operating conditions of the battery pack blocks; and a plurality of charge/discharge circuits each provided to the battery pack blocks, each charge/discharge circuit being provided with a relay open/close contact. A smoothing capacitor is connected between the positive charge/discharge terminal and the negative charge/discharge terminal in the vehicle. According to the method for inspecting relay contacts for a contact weld, the plurality of battery pack blocks allow the battery ECUs one by one in an arbitrary order to close the open/close contacts and deliver an inspection signal to the charge/discharge circuit, and the battery ECU of the other battery pack blocks determines whether the inspection signal has been received via a parallel connection circuit and the smoothing capacitor, thereby determining whether an open/close contact weld of the battery pack blocks has occurred or not. By following the aforementioned procedure on the plurality of battery pack blocks one by one, the open/close contact of a battery pack block that is found to have received the inspection signal is determined to be welded. That is, the welded and thereby closed open/close contact has formed a transmission path through which the inspection signal is transmitted to the battery ECU. By following this procedure successively on each of the battery pack blocks, it is possible to check the open/close contacts provided in all the battery pack blocks for a contact weld.

In the aforementioned method, it is preferable that one of the plurality of battery ECUs is set to a master and the others to slaves, each battery ECU being provided with a communication device and connected to each other via the communication line, and the slave battery ECUs transmit an inspection result of the open/close contacts to the master battery ECU by the communication device via the communication line. The master battery ECU collects the results of inspection of each relay contact for a contact weld and inform of the results an apparatus that uses the battery power source device.

Furthermore, the communication line can be connected to the vehicle, which employs the battery power source device as its drive power source, to form a network and transmit an inspection result to the vehicle therethrough. This makes it possible for the vehicle to know a welded relay contact and provide control to take countermeasures against it.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

Now, the present invention will be described below in more detail with reference to the accompanying drawings in accordance with the embodiment to further the understanding of the invention. The embodiment described below is an implementation example of the present invention and not intended to limit the technical scope of the invention.

Figure 1:
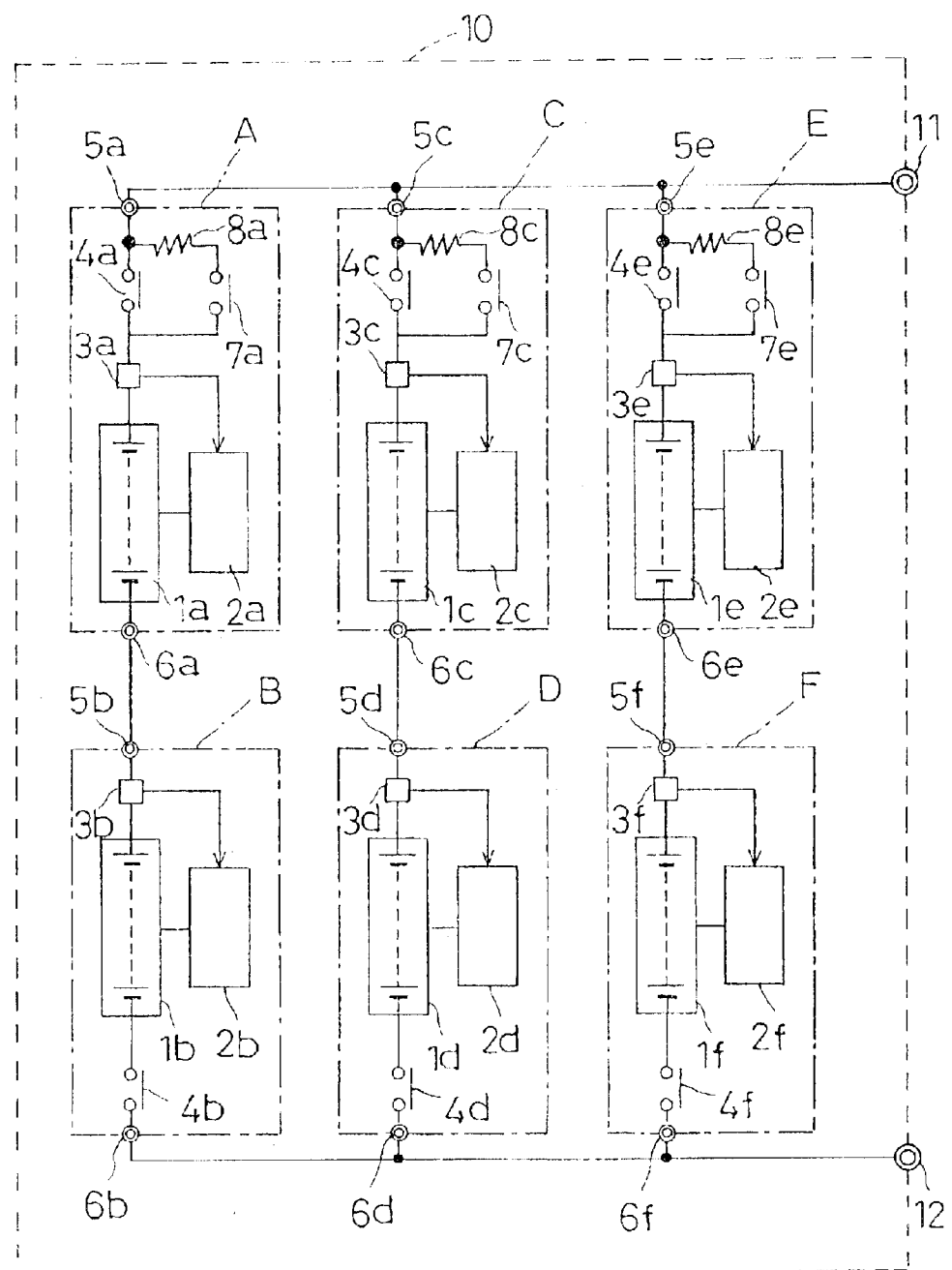
FIG. 1 is a block diagram showing the configuration of a battery power source device.

This embodiment relates to a battery power source device that is employed as a power source for driving a hybrid vehicle, especially a large hybrid vehicle, which incorporates a motor and an engine. As shown in FIG. 1, to meet a large power load demanded by the large hybrid vehicle, a battery power source device 10 according to this embodiment includes six battery pack blocks 1a to 1f in which the battery pack blocks 1a and 1b, the battery pack blocks 1c and 1d, and the battery pack blocks 1e and 1f are connected in series, respectively, and then those three serially connected sets are connected in parallel, or serially in parallel, so as to supply a large output voltage and output current.

The battery pack blocks 1a to 1f each include forty battery modules connected in series, each battery module having six nickel-metal hydride rechargeable batteries connected in series. The battery pack blocks 1a to 1f are further provided with sensing devices, such as current sensors 3a to 3f, voltage sensors (not shown), and temperature sensors (not shown), and cooling fans for cooling the batteries (not shown). Additionally, the battery pack blocks 1a to 1f are connected with battery ECUs 2a to 2f to constitute battery pack systems A to F, respectively.

The battery ECUs 2a to 2f monitor the operating conditions of the battery pack blocks 1a to 1f based on the charge/discharge current and voltage of the battery pack blocks 1a to 1f, the voltage and temperature of each battery module, and the temperature (ambient temperature) of the air for cooling the battery pack blocks 1a to 1f, all of which are detected by the current sensors 3a to 3f, and the voltage and temperature sensors. In addition, the battery ECUs 2a to 2f provide control to the rotation of the cooling fans and compute the SOC (State of Charge), that is the amount of charge accumulated relative to the battery capacity, based on the voltages, currents, and temperatures detected, requiring a vehicle ECU serving as a vehicle controller to provide such a charge and discharge state so as to maintain the SOC at an appropriate state. The data on the voltage, current, and temperature as well as the computed SOC are delivered to the vehicle ECU as information on the operating condition.

Figure 2:
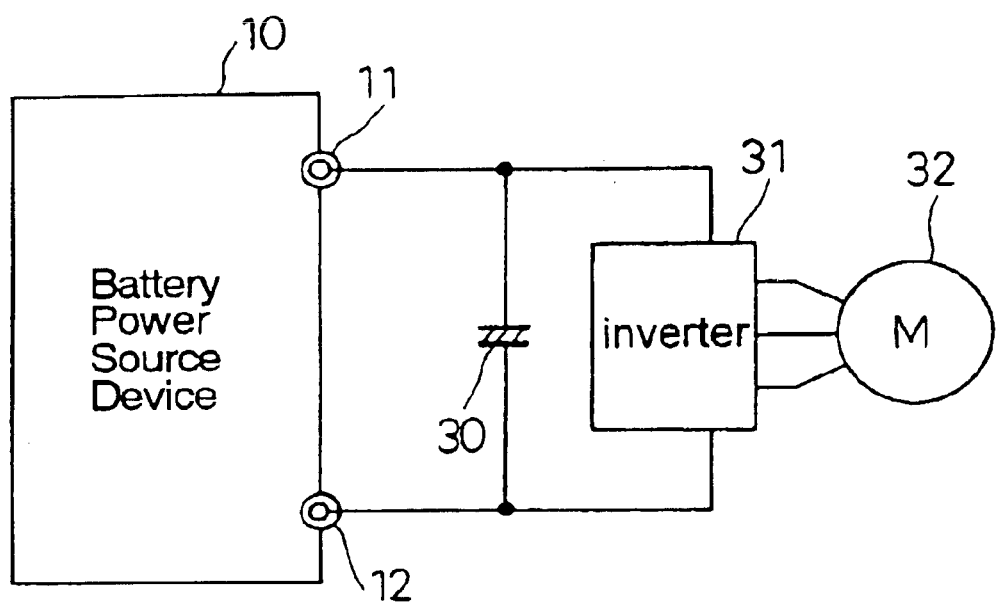
FIG. 2 is a block diagram showing the configuration of external connections of the battery power source device.

The battery pack blocks 1a to 1f are provided with open/close relay contacts 4a to 4f which are connected in series thereto and closed only upon operation of the battery power source device, thereby preventing an operator from receiving an electric shock when the operator contacts, upon assembly or maintenance, positive terminals 5a to 5f and negative terminals 6a to 6f, a positive charge/discharge terminal 11, and a negative charge/discharge terminal 12, which are externally exposed. The battery pack blocks 1a, 1c, and 1e, serving as the positive side in the serial connection, are provided with secondary open/close contacts 7a, 7c, and 7e via resistors 8a, 8c, and 8e in parallel with the open/close relay contacts 4a, 4c, and 4e. As shown in FIG. 2, upon starting the battery power source device 10, the secondary open/close contacts 7a, 7c, and 7e are turned on prior to the open/close relay contacts 4a, 4c, and 4e, thereby preventing an excessive inrush current caused by a charge current flowing into a smoothing capacitor 30 that is connected between the positive charge/discharge terminal 11 and the negative charge/discharge terminal 12.

There is a possibility of causing the open/close relay contacts 4a to 4f and the secondary open/close contacts 7a, 7c, and 7e to be welded due to a large current passing therethrough. In this context, upon starting the battery power source device 10 or when the battery power source device 10 begins to supply power to the hybrid vehicle, an inspection is automatically performed for a contact weld of the open/close relay contacts 4a to 4f and the secondary open/close contacts 7a, 7c, and 7e. Now, a method of inspecting for a contact weld is described below.

As shown in FIG. 2, when the battery power source device 10 is mounted in the hybrid vehicle, the smoothing capacitor 30 and an inverter 31 are connected between the positive charge/discharge terminal 11 and the negative charge/discharge terminal 12. The inverter 31 converts direct current power supplied by the battery power source device 10 into alternating current power to drive a motor 32 for driving the vehicle.

Figure 3:
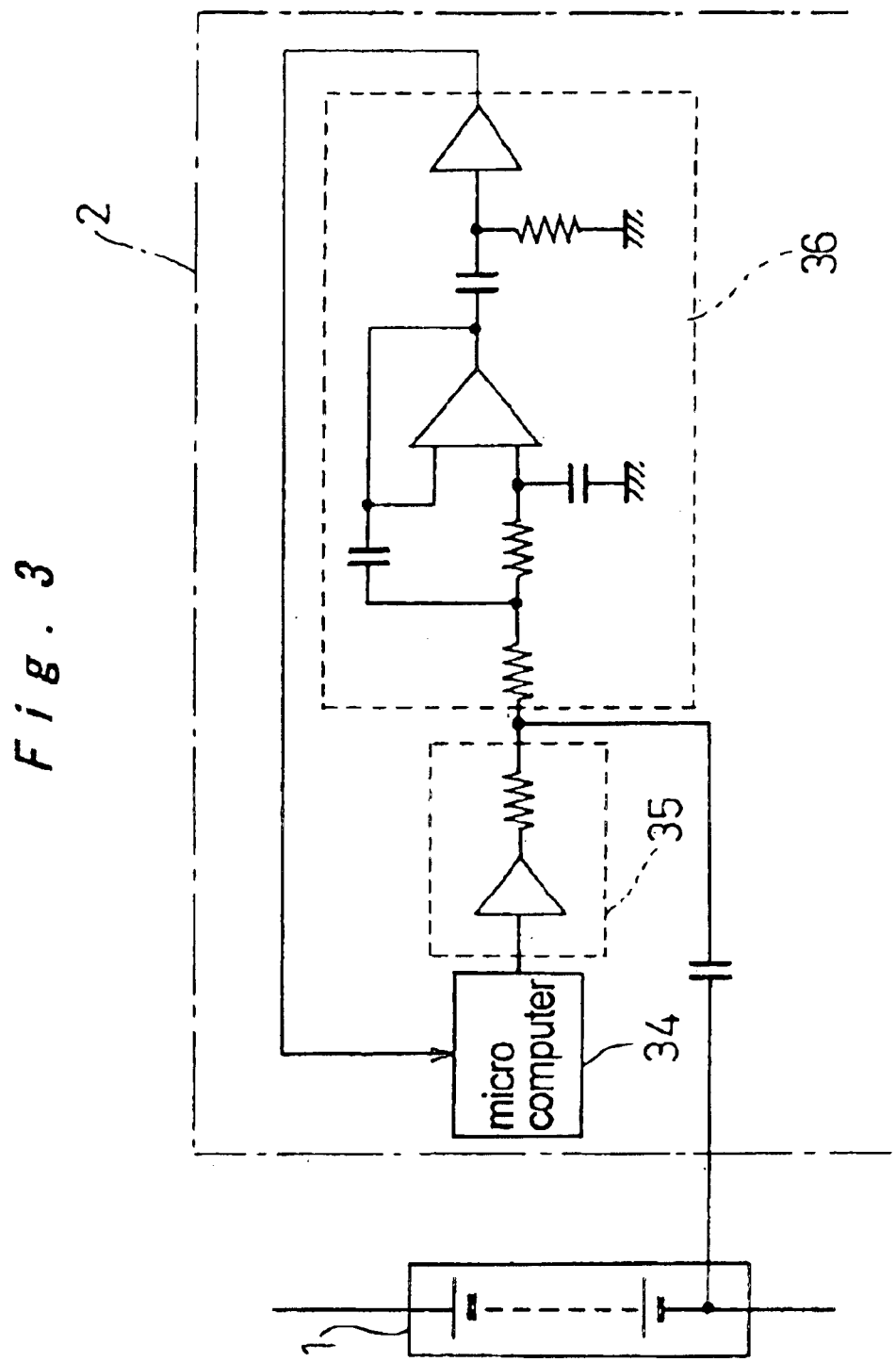
FIG. 3 is a block diagram showing the internal configuration of a battery ECU for use with an inspection for a contact weld.
Figure 4:
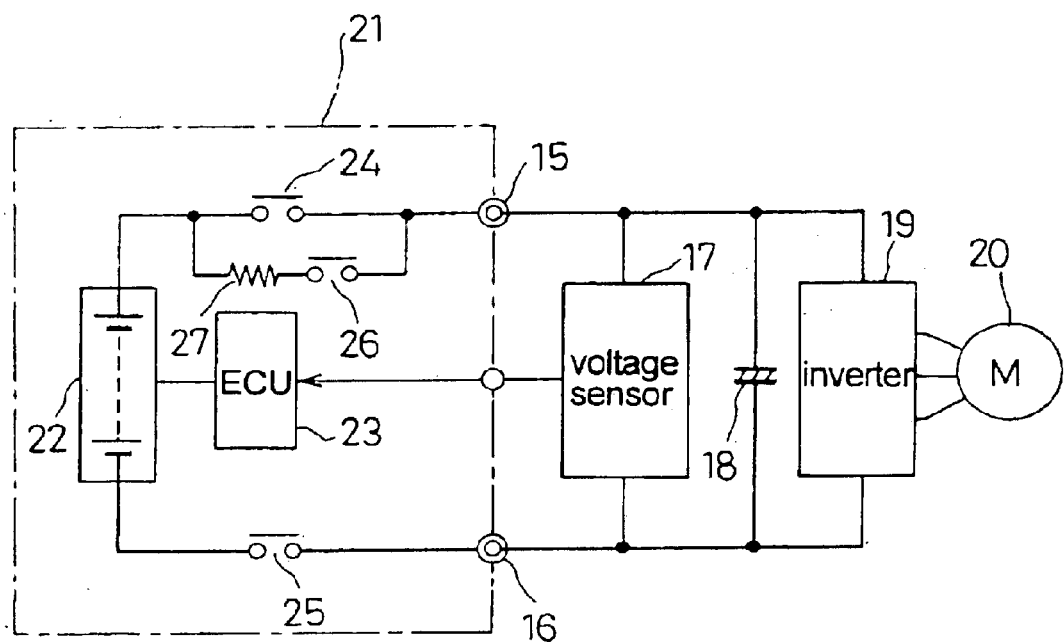
FIG. 4 is a block diagram illustrating the arrangement of a conventional inspection for a contact weld.

As shown in FIG. 3, in the battery ECUs 2a to 2f, connected to a microcomputer 34 are an inspection signal transmitter circuit 35 for outputting an inspection signal and an inspection signal receiver circuit 36 for checking for an inspection signal or detecting the peak value of sinusoidal waves. Since the battery ECUs 2a to 2f and the battery pack blocks 1a to 1f have circuits configured in the same way, they are labeled with the battery ECU 2 and the battery pack block 1 in FIG. 3. The inspection signal transmitter circuit 35 shapes the waveform of and provides gain control to a signal delivered by the microcomputer 34 to deliver a sinusoidal wave having a predetermined peak value to the negative side of the battery pack block 1. On the other hand, the inspection signal receiver circuit 36 determines whether the inspection signal delivered by another battery ECU 2 has been transmitted to the negative side of the battery pack block 1, and is configured as a band pass filter.

In the inspection for a contact weld, one of the six battery pack systems A to F transmits an inspection signal, and the other five systems determine whether the inspection signal has been received. The inspection can be performed in any order. For example, with the battery pack system A serving as a transmitting system, the battery ECU 2a turns on the open/close relay contact 4a or the secondary open/close contact 7a while delivering the inspection signal from the inspection signal transmitter circuit 35, thereby checking for a contact weld of each of the open/close contacts 4c, 4d, 4e, and 4f of the battery pack systems C, D, E, and F and the secondary open/close contacts 7c and 7e. The battery pack system B is connected in series to the battery pack system A, thus detecting the inspection signal irrespective of the presence or absence of a short circuit of the open/close contact 4b. This inspection signal is transmitted through the closed open/close contact 4a or the closed secondary open/close contact 7a to the battery pack systems C and E arranged in parallel therewith as well as through the positive charge/discharge terminal 11, the smoothing capacitor 30, and the negative charge/discharge terminal 12 to the battery pack systems B, D, and F arranged in series therewith.

At this time, if no inspection signal is received at the battery pack systems C, D, E, and F, it is determined that the open/close relay contacts 4c, 4d, 4e, and 4f of the battery pack systems C, D, E, and F and the secondary open/close contacts 7c and 7e have not been welded. Subsequently, the same procedure is followed by the battery pack system C transmitting the inspection signal, and all the battery pack systems A to F are determined not to be welded if no inspection signal is received at the battery pack systems A, B, E, and F.

For example, suppose that the contact weld of the open/close contact 4d of the battery pack system D has occurred among the battery pack systems C, D, E, and F. In this case, the inspection signal transmitted is received at the battery ECU 2d and then sensed at the microcomputer 34 through the inspection signal receiver circuit 36. At the same time, the inspection signal is also received at the battery pack system C that is serially connected to the battery pack system D. Thus, it is not possible to determine which of the open/close contacts 4c, 4d and the secondary open/close contact 7c in the battery pack system C or the battery pack system D are welded, however, it can be known that at least one of the battery pack systems C and D is welded. To determine whether the battery pack system C or the battery pack system D is welded, the same procedure is followed by the battery pack system C transmitting the inspection signal with the open/close contact 4c and the secondary open/close contact 7c being turned off. If it is found that no inspection signal is sensed at both the battery pack systems C and D, then it is determined that the open/close contact 4d of the battery pack system D is welded.

In this manner, by carrying out the inspection for a contact weld twice, the open/close contacts and the secondary open/close contacts of all the battery pack systems are checked for a contact weld, thereby reducing the time required to find a contact weld.

To perform the inspection automatically, with one of the battery pack systems A to F being set as a master and the other five being set as slaves, each of the battery ECUs 2a to 2f is provided with a communication device and connected to each other via communication lines. For example, with the battery ECU 2a of the battery pack system A being employed as a master, the battery ECU 2a provides control to and assigns an inspection signal to itself and the other battery pack systems B to F to collect inspection results through the communication lines. Since the communication lines can be connected to a vehicle control network, the results of the inspection for a contact weld can be transmitted from the battery ECU 2a, serving as the master, to the vehicle so as to provide control to take countermeasures against a welded contact or data for maintenance.

As described above, according to the present invention, in the battery power source device having a plurality of battery pack blocks connected in parallel or serially in parallel, a contact weld in a relay open/close contact connected to each battery pack block is detected without employing a voltage sensor or the like external to the battery power source device.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A method of inspecting relay contacts for a contact weld in a battery power source device, the battery power source device including a plurality of battery pack systems connected in series, in parallel, or in a series-parallel arrangement, each battery pack system having a battery pack block having a plurality of rechargeable batteries serially connected for charging and discharging operations in a vehicle via a positive charge/discharge terminal and a negative charge/discharge terminal that are connected to the battery pack systems; a battery electronic control unit (ECU) connected with the battery pack block, that controls an operating condition of the battery pack block; and a charge/discharge circuit included with the battery pack block, the charge/discharge circuit having a relay open/close contact, a smoothing capacitor connected between the positive charge/discharge terminal and the negative charge/discharge terminal in the vehicle, the method comprising:

determining the existence of an open/close contact weld of the battery pack block by closing the open/close contacts, with the battery ECUs, one by one in an arbitrary order;

delivering an inspection signal to the charge/discharge circuit; and determining, with the battery ECU of the other battery pack systems, whether the inspection signal has been received through a parallel connection circuit and the smoothing capacitor.

2. The method of inspecting relay contacts for a contact weld in a battery power source device according to claim 1, wherein one of the plurality of battery ECUs is set as a master ECU and the remaining ECUs are set as slave ECUs, each battery ECU including a communication device connected to the other ECUs via a communication line, and the slave battery ECUs transmit an inspection result of the open/close contacts to the master battery ECU with the communication device via the communication line.

3. The method of inspecting relay contacts for a contact weld in a battery power source device according to claim 2, wherein the communication line is connected to the vehicle to form a network that transmits an inspection result to the vehicle.

4. A method of inspecting relay contacts for a contact weld in a battery power source device, the battery power source device including a plurality of battery pack systems connected in series, in parallel, or in a series-parallel arrangement, each battery pack system having a battery pack block having a plurality of rechargeable batteries serially connected for charging and discharging operations in a vehicle via a positive charge/discharge terminal and a negative charge/discharge terminal that are connected to the battery pack systems; a battery electronic control unit (ECU) connected with the battery pack block, that controls an operating condition of the battery pack block; and a charge/discharge circuit included with the battery pack block, the charge/discharge circuit having a relay open/close contact, a smoothing capacitor connected between the positive charge/discharge terminal and the negative charge/discharge terminal in the vehicle, the method comprising:

determining the existence of an open/close contact weld of the battery pack block by closing the open/close contacts, with the battery ECUs, one by one in an arbitrary order;

delivering an inspection signal to the charge/discharge circuit; and determining, with the battery ECU of the other battery pack systems, whether the inspection signal has been received through a parallel connection circuit and the smoothing capacitor, wherein one of the plurality of battery ECUs is set as a master ECU and the remaining ECUs are set as slave ECUs, each battery ECU including a communication device connected to the other ECUs via a communication line, and the slave battery ECUs transmit an inspection result of the open/close contacts to the master battery ECU with the communication device via the communication line.

5. The method of inspecting relay contacts for a contact weld in a battery power source device according to claim 4, wherein the communication line is connected to the vehicle to form a network that transmits an inspection result to the vehicle.

* * * * *